(12) United States Patent
Dumoulin

(10) Patent No.: US 6,201,987 B1
(45) Date of Patent: Mar. 13, 2001

(54) ERROR COMPENSATION FOR DEVICE TRACKING SYSTEMS EMPLOYING ELECTROMAGNETIC FIELDS

(75) Inventor: Charles Lucian Dumoulin, Ballston Lake, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/084,336

(22) Filed: May 26, 1998

(51) Int. Cl.[7] ..................................................... A61B 5/05
(52) U.S. Cl. ..................... 600/424; 324/318; 324/207.12
(58) Field of Search ................................. 600/424, 423, 600/410; 128/899; 324/207.11–207.17, 207.22, 260, 309, 318

(56) References Cited

U.S. PATENT DOCUMENTS

| | | | |
|---|---|---|---|
| 5,307,808 | | 5/1994 | Dumoulin et al. . |
| 5,365,927 | * | 11/1994 | Roemer et al. ................... 128/653.2 |
| 5,372,137 | * | 12/1994 | Wong et al. . |
| 5,377,678 | | 1/1995 | Dumoulin et al. . |
| 5,655,533 | * | 8/1997 | Petropoulos et al. . |
| 5,830,142 | * | 11/1998 | Kuhara . |
| 5,865,177 | * | 2/1999 | Segawa . |
| 5,929,638 | * | 7/1999 | Aldefeld et al. ...................... 324/307 |
| 6,078,177 | * | 6/2000 | Petropoulos et al. ................. 324/318 |
| 6,100,692 | * | 8/2000 | Petropoulos et al. ................. 324/318 |
| 6,100,695 | * | 8/2000 | DeMeester et al. ................. 324/318 |

* cited by examiner

*Primary Examiner*—Marvin M. Lateef
*Assistant Examiner*—Shawna J Shaw
(74) *Attorney, Agent, or Firm*—Jean K. Testa; Marvin Snyder (57) ABSTRACT

The present invention is capable of more accurately tracking an invasive device in a subject's body in the presence of eddy current inducing structures. Current patterns applied to the tracking system's transmit coils are modified to compensate for the effect of the eddy currents. The current supplied to the coils is a linear combination of the current needed to create the desired electromagnetic field in the region of interest; and one or more error terms. These terms are determined experimentally during system calibration and are mathematically modeled as a series of exponential functions having a given amplitude and time constant. The error terms in the current applied to the transmit coils cancel the magnetic fields created by eddy currents within the tracking region and result in an actual electromagnetic field which is close to the desired ideal electromagnetic field. The fidelity of the electromagnetic field is further increased by reducing eddy currents within the eddy current inducing structures. This is done by constructing shield coils which are placed between the transmit coil and the eddy current inducing structures. These shield coils create canceling magnetic fields within the eddy current inducing structures without substantially altering the electromagnetic fields in the region over which the invasive device is tracked.

10 Claims, 11 Drawing Sheets

ERROR COMPENSATION FOR DEVICE TRACKING SYSTEMS EMPLOYING ELECTROMAGNETIC FIELDS

BACKGROUND OF THE INVENTION

1. Field of the Invention

This invention relates to medical imaging systems, and more particularly to imaging systems to locate one or more devices in real-time within or near the imaging volume of the system.

2. Discussion of Prior Art

Several methods exist to follow the location of an invasive device within the body. These methods include MR tracking as disclosed in "Tracking System and Pulse Sequences to Monitor the Position of a Device Using Magnetic Resonance", C. L. Dumoulin, S. P. Souza and R. D. Darrow (U.S. Pat. No. 5,307,808) and radio frequency tracking as disclosed in "Tracking System to Follow the Position and Orientation of a Device Using Radio-Frequency Fields", C. L. Dumoulin, J. F. Schenck, and P. B. Roemer (U.S. Pat. No. 5,377,678). Magnetic resonance tracking methods employ the same physical principles to both locate a device and acquire an MR image, and hence provide excellent registration within the context of the MR image. Positional accuracy of radio frequency tracking, on the other hand, can be degraded by the presence of metallic structures near the tracked device. This loss in positional accuracy can be significant and must be addressed if RF tracking systems are to be used with confidence for invasive medical procedures.

An rf tracking system employs low-frequency electromagnetic fields which are broadcast from an array of transmitter coils and detected by one or more pickup coils, or probes. By measuring the strength of the detected magnetic field, in principle, one can determine the location and orientation of the probes.

The presence of metallic structures near the transmit coils can change the magnetic field sensed by the pickup coils. This in turn, creates an error in the computed position and orientation of the pickup coil. Two mechanisms are possible. First, if the metallic structure is non-ferromagnetic, but conducts electricity, eddy currents are created in the structure. These eddy currents create an "image" field which partially cancels the field at the pickup coil. Larger structures, particularly those which permit eddy currents to flow in large loops are more prone to creating eddy currents. In addition, eddy currents will tend to build up and decay with time constants which are determined by the content and geometry of the eddy-current inducing structures. Thus, eddy currents will introduce a time dependency in the detected signal. If desired, this time dependency can be used as an indicator of the presence of eddy currents.

The second mechanism in which metallic structures interact with the excitation coils occurs when ferromagnetic material is brought near the coils. Ferromagnetic material placed near a transmit coil can change the inductance of the coil and thereby change the efficiency with which the coil makes the detected magnetic field.

If an rf tracking system is to be used in an environment with appreciable amounts of nearby metal (e.g. an MR imaging system) then solutions to the problem of eddy currents are needed. If eddy currents are allowed to distort the acquired data, then errors in positional measurements of the tracked device will occur. What is needed is a means to prevent and/or correct positional errors caused by the proximity of metallic structures within the tracking region of an RF tracking system.

BRIEF DESCRIPTION OF THE DRAWINGS

The features of the invention believed to be novel are set forth with particularity in the appended claims. The invention itself, however, both as to organization and method of operation, together with further objects and advantages thereof, may be best understood by reference to the following description taken in conjunction with the accompanying drawing in which:

SUMMARY OF THE INVENTION

A system for the real-time localization of a device using electromagnetic (or Radio Frequency) fields is employed. The system is augmented with hardware and/or software which compensates for eddy currents. Eddy currents induced in conducting structures by the transmit coils of an rf tracking system are compensated by modifying the waveforms which are applied to the transmitter coils. In the absence of eddy current effects, the field established in the space near the transmit coil will follow the drive current applied to the coil. Ideally, the current and the resulting applied field are uniform in time. In the presence of electrically conducting structures, however, eddy currents are created. These eddy currents create their own magnetic field which opposes the field created by the transmit coil. These currents (and hence the field created by them) decay over time. Since, the magnetic field in the space near the transmit coil is the sum of the fields created by the eddy currents and the transmit coil, the actual field at a selected point is space has both a constant component (the ideal portion) and a time-varying portion created by the eddy currents.

In order to compensate for these eddy currents, the current waveform sent to the transmit coil is modified in a first embodiment of the present invention. A simple calibration procedure is used to measure the amplitude and time constants of the eddy currents over the volume of interest. The amplitude of the waveform applied to the transmit coil is then changed in time to give a pre-emphasized waveform. This waveform is either computed digitally or derived with analog circuitry. One particularly useful mathematical function for eddy current compensation is the linear combination of a small number of exponentials, each with its own time constant and amplitude. When waveform pre-emphasis is done, the strength of the magnetic field established in the region of interest more closely follows the desired ideal magnetic field.

In a second and complementary embodiment of the present invention, eddy currents induced in nearby metallic structures by the transmit coils of the rf tracking system are reduced by incorporating active shielding of the coils. This is done by placing one or more additional coils at selected locations behind, and/or to the sides of, the transmit coil. The location and coil winding pattern of the shield coil are chosen to cancel the magnetic fields of the transmit coil at the location of the shield coil. A convenient way to design this shield is to first choose the location, geometry and size of the shielding. By assuming that the shield is a superconducting sheet, one can calculate the currents that are created in the sheet by the transmit coil. A coil winding pattern that follows these currents will provide the optimal level of shielding provided that electrical currents which cancel the induced currents are inserted into the shield coil. In general, larger shields will provide better shielding.

Since the shield coil creates its own dipole, the shape of the iso-field contour in the tracked volume will be altered. This change, however, is readily quantifiable and should present no problem to robust tracking. Because the two coils oppose each other, the combination of transmit and shield coil will require more power to achieve the same field over the tracking volume. The power requirements will go up as the gap between the transmit and shield coils is reduced. It is important to note that the shield can have any geometry. For example, hemispherical shields, or shields fitted to eddy-current inducing structures are possible.

OBJECTS OF THE INVENTION

It is an object of the present invention to provide accurate tracking of devices using electromagnetic fields, even in the presence of eddy-current inducing structures.

It is another object of the present invention to provide pre-emphasized waveforms to the excitation coils of an RF tracking system.

It is another object of the present invention to provide active cancellation of magnetic fields in eddy-current producing regions of an RF tracking system.

DETAILED DESCRIPTION OF THE INVENTION

Figure 1:
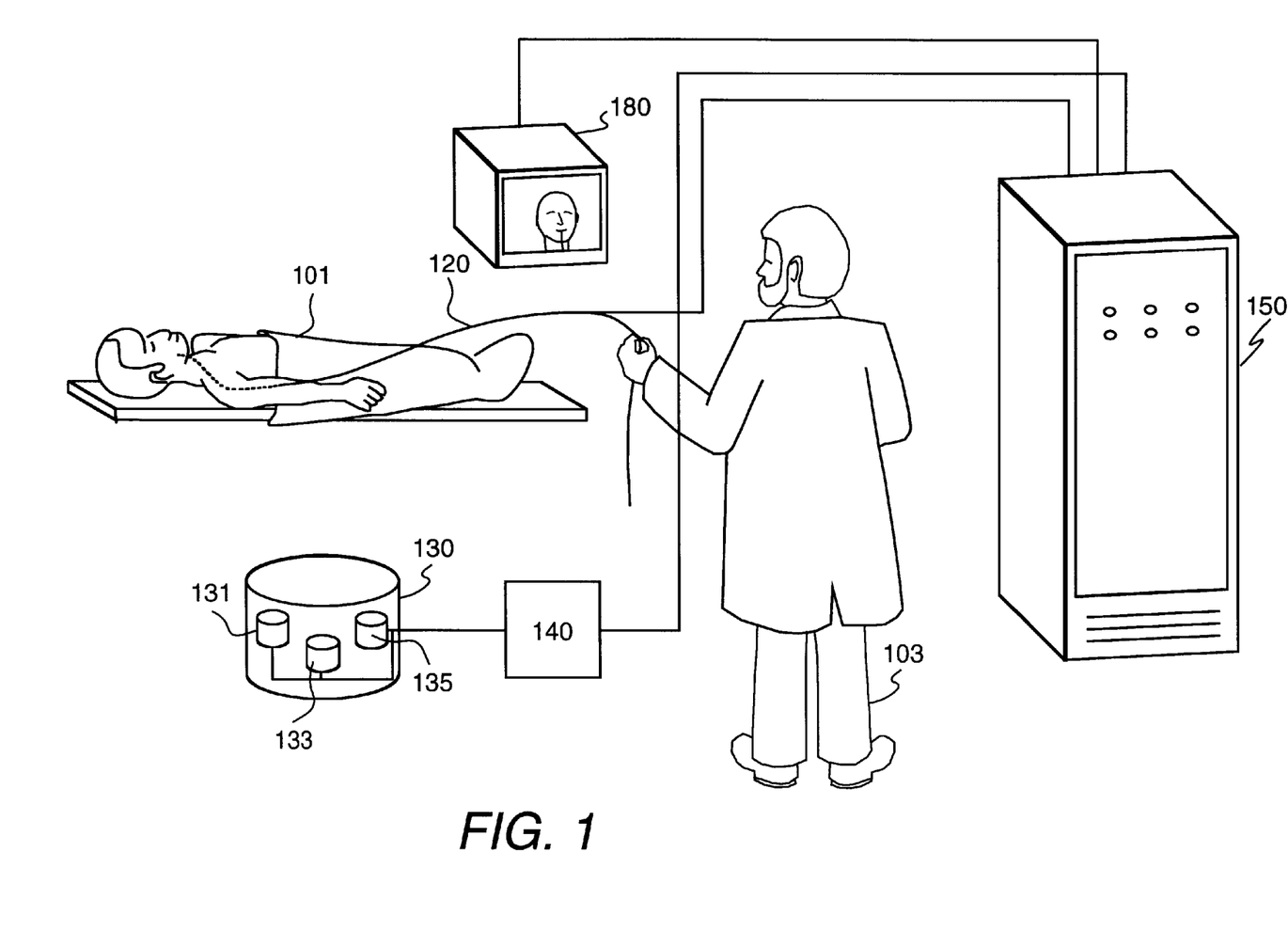
FIG. 1 is a simplified block diagram of an RF tracking system used to follow an invasive device in real-time in accordance with the present invention.

An overview of a system for following an invasive device 120, such as a catheter, within a subject 101 according to the present invention is shown in FIG. 1. The system is comprised of a transmit coil assembly 130 which creates time-varying magnetic fields within subject 101, a set of system electronics 150 which provides drive current to transmit coils within transmit coil assembly 130, a current correction means 140 which modifies the current applied to transmit coil assembly, one or more receive coils incorporated into invasive device 120, and a display means 180 for displaying the instantaneous location of device 120 to an operator 103. Magnetic field changes detected by the receive coils of invasive device 120 are converted to electrical signals which are propagated to system electronics 150 for interpretation into positional information.

In a simple implementation of the present invention, transmit coil assembly 130 incorporates a first transmit coil 131a, a second transmit coil 133 and a third transmit coil 135 operating at the same frequency and activated one at a time by system electronics 150. Low frequency rf signals (e.g. about 1 kHz) can be chosen so that the wavelength is long, and only near-field effects need be considered. Note that other combinations of transmit and receive coils are possible. For example, may be desirable to configure the tracking system to operate with five or six transmit coils and a single receive coil, or with a single transmit coil and five or six receive coils. Also, because of the principle of reciprocity, it should be possible (although not necessarily desirable) to interchange the functions of the transmit and receive coils.

Figure 2:
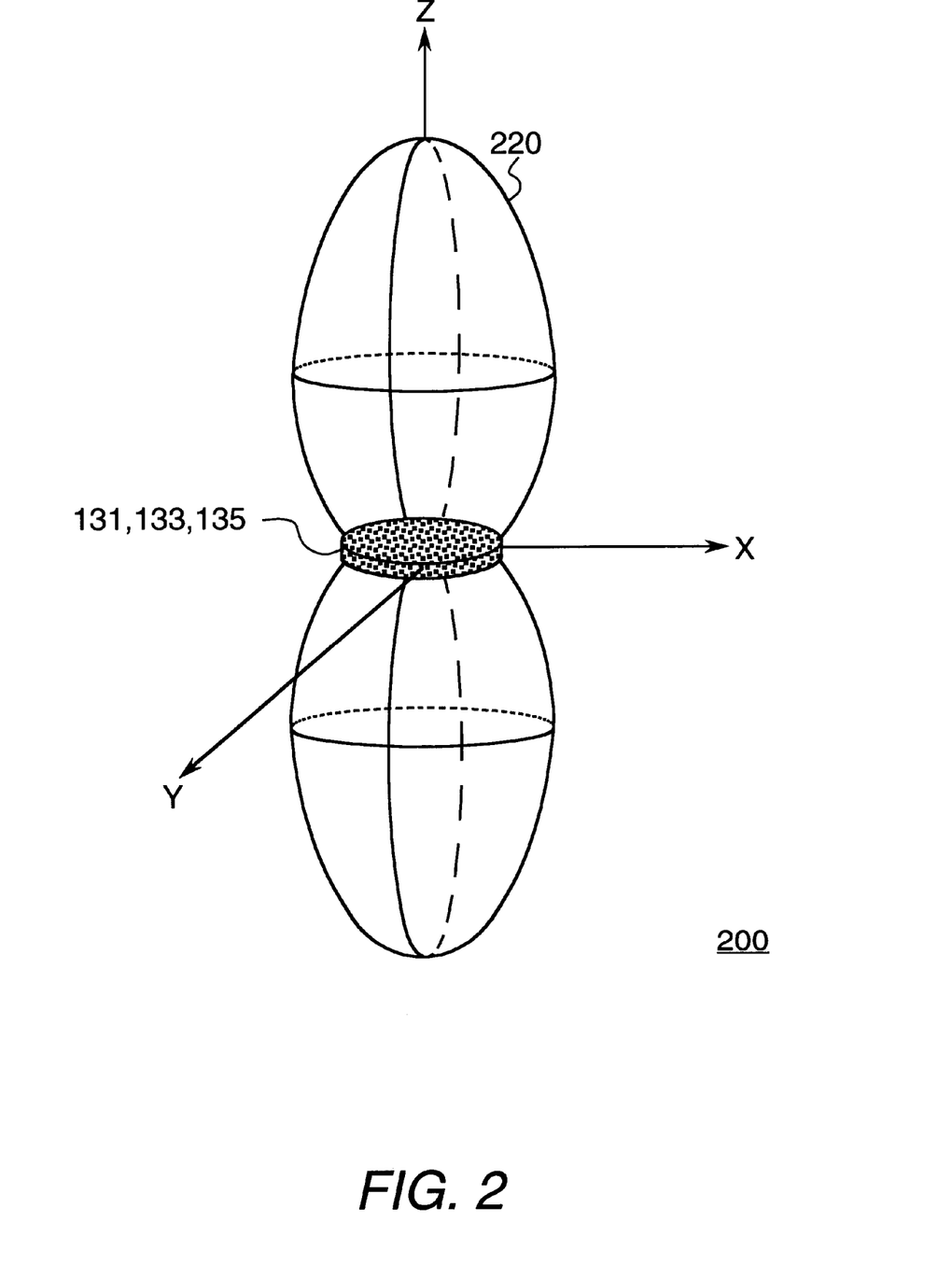
FIG. 2 is a simplified diagram illustrating an iso-field contour generated by a single electrical excitation coil.

As current flows in each coil of transmit coil assembly 130, a magnetic field is generated within subject 101. This magnetic field has a dipole geometry 200 as illustrated in FIG. 2. A receive (or pickup) coil such as receive coils 121, 123, 125 incorporated into device 120 can detect the magnetic field generated by a transmit coil within transmit coil assembly 130 by measuring the amount of current induced in receive coil 121, 123, 125 as the magnetic field changes over time (note that static magnetic fields do not induce current in receive coils 121, 123, 125).

Figure 3:
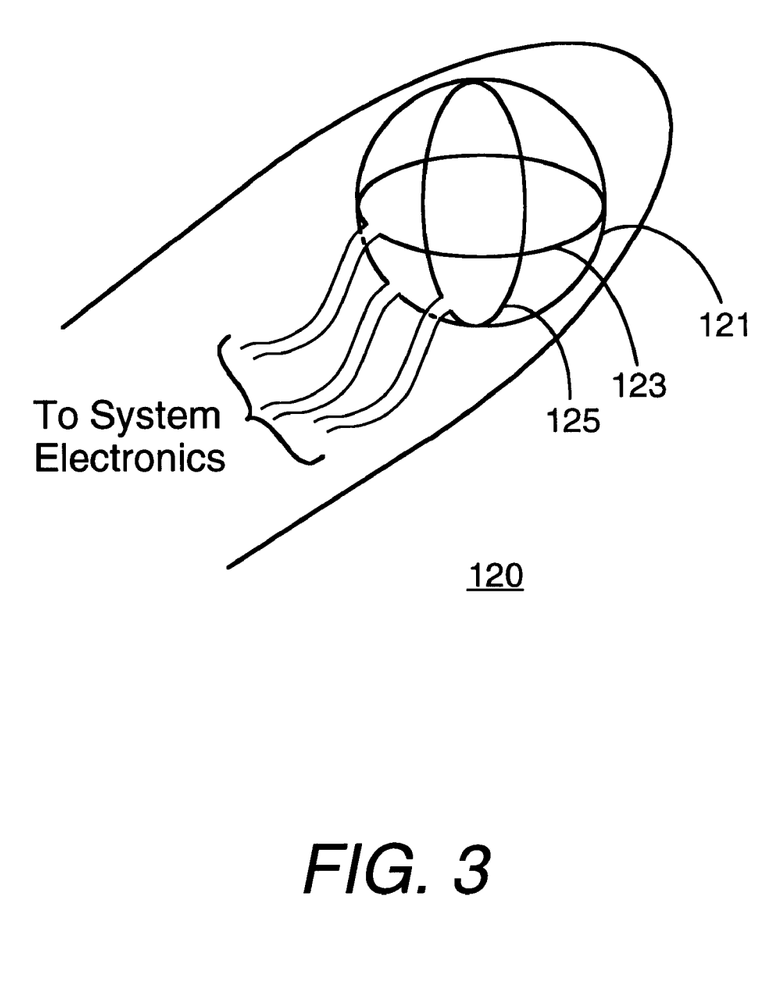
FIG. 3 is a diagram illustrating three mutually orthogonal receive coils incorporated into the invasive device of FIG. 1.

The sensitivity of receive coil 121, 123, 125 depend on how each coil is oriented to the magnetic field created by a single transmit coil 131, 133, 135. Maximum sensitivity will occur when the axis of the pickup coil is parallel to the direction of the magnetic field, and minimum sensitivity occurs when the axis of the pickup coil is perpendicular to the field. Consequently, a single pickup coil cannot be used to quantify the magnetic field at a given point in space since the pickup coil cannot be guaranteed to be optimally oriented. This limitation is easily overcome, however, by employing three pickup coils as shown in FIG. 3. In this illustration a first receive coil 121 is combined with a second receive coil 123 and a third receive coil 125 within invasive device 120. Each of the receive coils 121, 123, 125 are oriented perpendicular to one another. By simultaneously detecting the induced currents in three mutually orthogonal coils, the vector (i.e. the direction and magnitude) of the magnetic field at the location of the probe can be determined.

Figure 4:
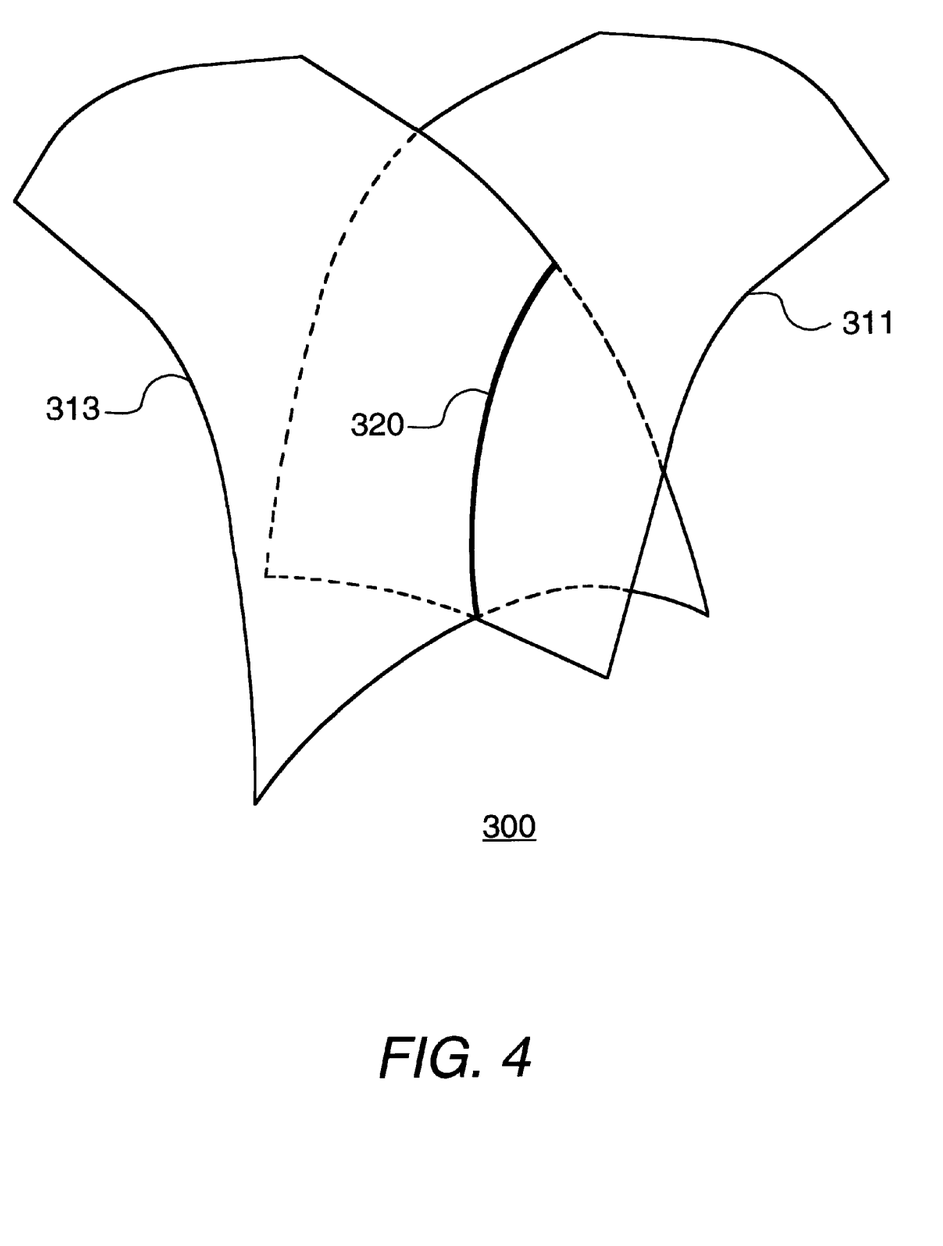
FIG. 4 is an illustration of the overlap between two iso-field contours created by two different electrical excitation coils.

Given the strength of the magnetic field detected by the pickup coils located within device 120, and knowledge of the strength of the magnetic field dipole created by each of the single transmit coils 210 within transmit coil assembly 130, one can easily determine an iso-field contour 220 that the pickup coils are on. Knowing the iso-field contour at device 120 is not sufficient to locate the probe, however. In order to locate the pickup coil additional iso-field contours can be created by other transmit coils within transmit coil assembly 130. This is illustrated in FIG. 4. By measuring the magnitude of a first iso-field contour 311 created by first transmit coil 131 and the magnitude of a second iso-field contour 313 created by second transmit coil 133, enough additional information can be obtained to constrain the location of the pickup coil to an intersection curve 320 defined by the intersection of first iso-field contour 311 and second iso-field contour 313.

The location of the pickup coil can be further constrained by identifying a third iso-field contour created by third transmit coil 135. This restricts the possible locations of the pickup coils to the intersection of the three surfaces (i.e. a point). Note that this approach is similar to the way that the Global Positioning System (GPS) operates (although GPS relies on time delays in signals rather than the strength of the detected signal). Mathematically, this process is carried out by solving three equations with three unknowns.

The presence of metallic structures near the volume over which tracking is performed can change the magnetic field sensed by the pickup coils. This in turn, creates an error in the computed position and orientation of the pickup coil. Two mechanisms are possible. First, if the metallic structure is non-ferromagnetic, but conducts electricity, eddy currents are created in the structure. These eddy currents create an "image" field which partially cancels the field at the pickup coil. Larger structures, particularly those which permit eddy currents to flow in large loops are more prone to creating eddy currents. Eddy currents will tend to build up and decay with time constants which are determined by the content and geometry of the eddy-current inducing structures. Thus eddy currents will introduce a time dependency in the detected signal. If desired, this time dependency can be used as an indicator of the presence of eddy currents.

The second mechanism in which metallic structures interact with the excitation coils occurs when ferromagnetic material is brought near the coils. Ferromagnetic material placed near a transmit coil can change the inductance of the coil and thereby change the efficiency with which the coil makes the detected magnetic field.

In accordance with the present invention deviations in the magnetic field created by eddy currents in nearby conducting structures are compensated by modifying the time-dependent magnetic fields used for tracking. These fields are created by electrical current flowing through each of the transmit coils of transmit coil assembly 130. The current which is made to flow is created by systems electronics 150.

Figure 5:
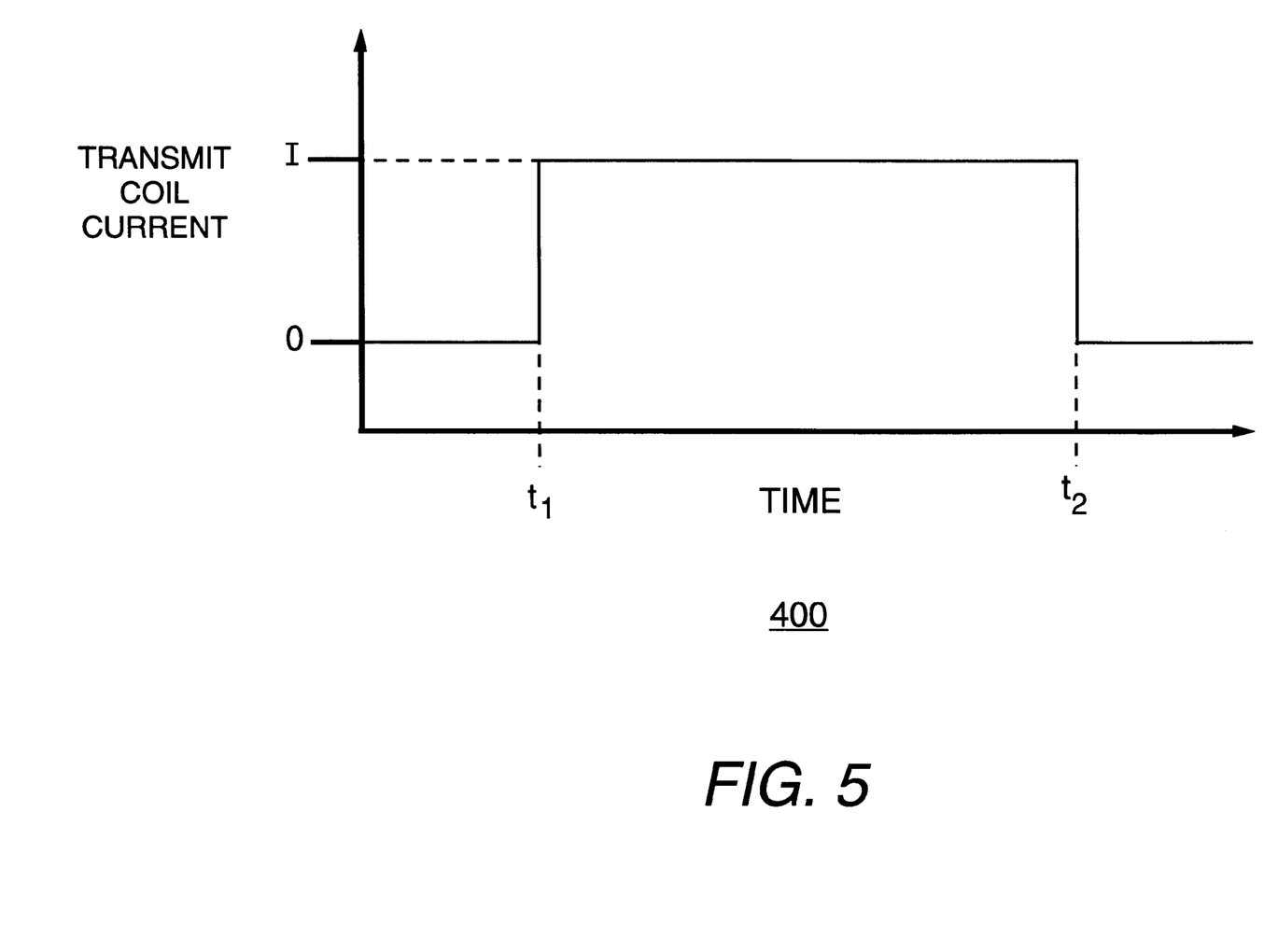
FIG. 5 is a diagram showing current vs. time in an excitation coil by the RF tracking system.

FIG. 5 illustrates an idealized current flow pattern 400 with current I starting at time $t_1$, and continuing until time $t_2$. In this idealized case, the current is zero before $t_1$ and after $t_2$. Between $t_1$ and $t_2$, field creation the current is constant.

Figure 6:
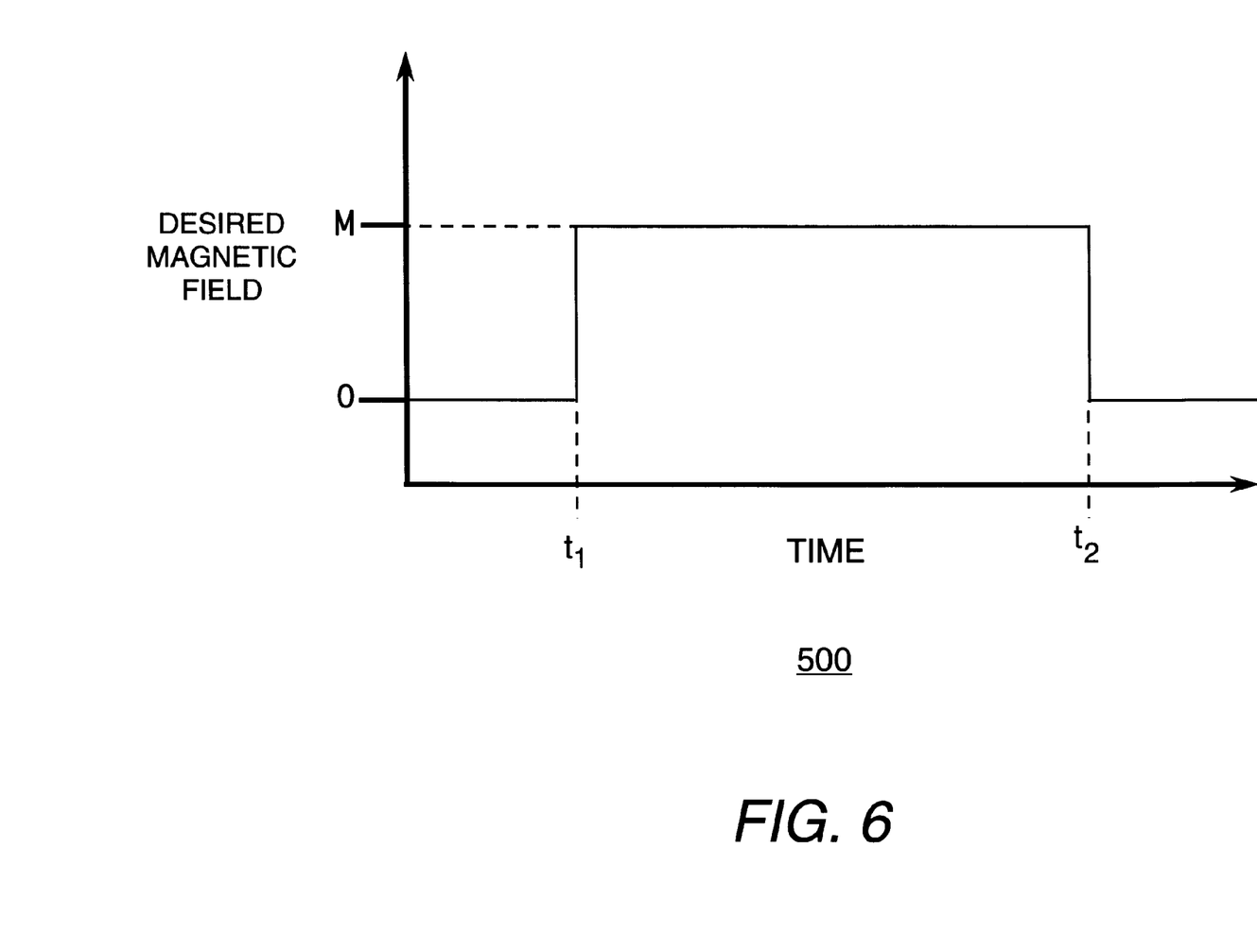
FIG. 6 is a diagram showing the desired magnetic field change vs. time created by the current shown in FIG. 5, at a selected point in space near the excitation coil.

An idealized magnetic field pattern 500 created by the ideal current flow of FIG. 5, is illustrated in FIG. 6. As expected, the field is absent before $t_1$ and after $t_2$ and is proportional to the current I between $t_1$ and $t_2$, when the current is applied.

Figure 7:
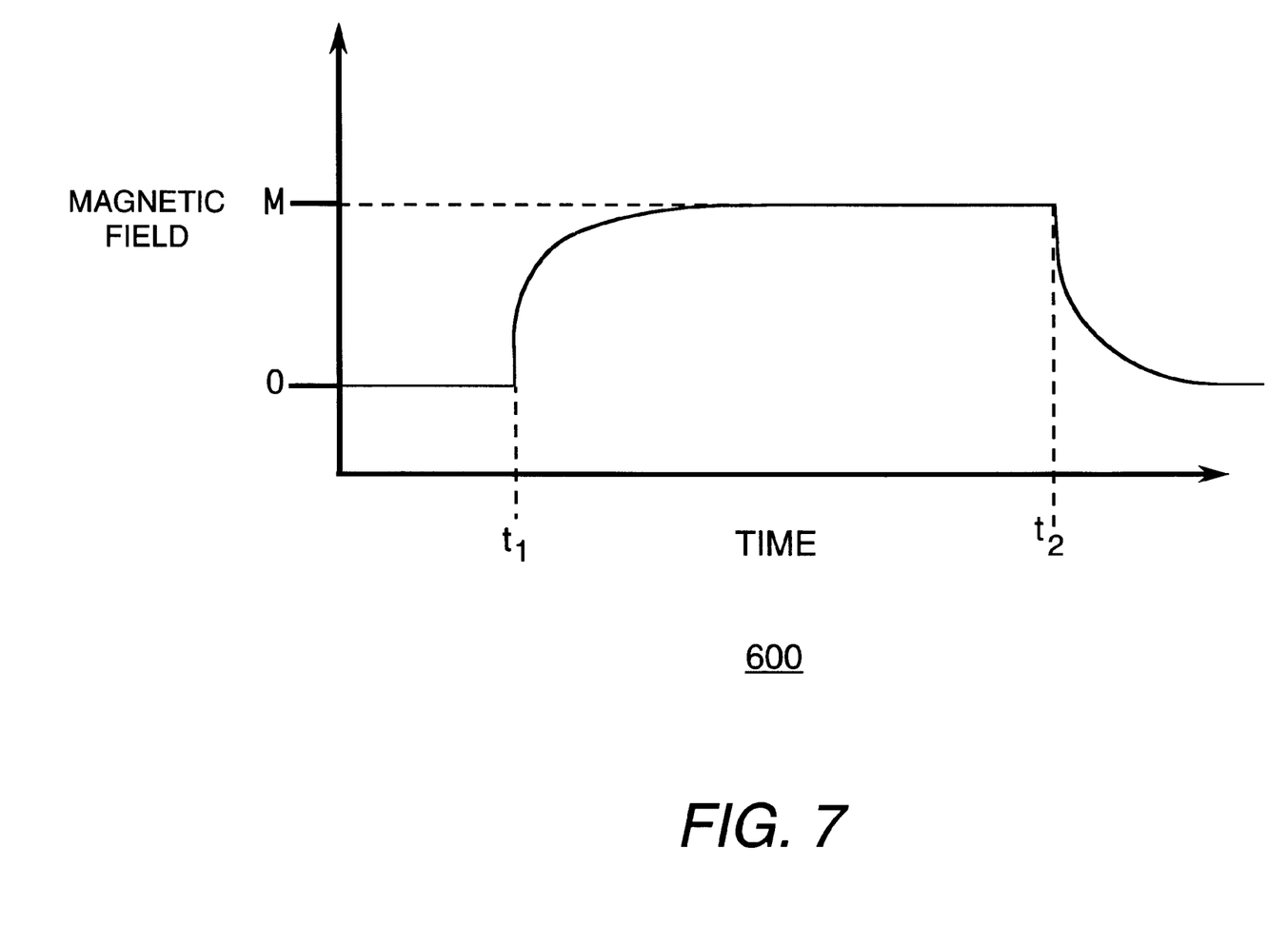
FIG. 7 is a diagram showing the actual magnetic field change vs. time created by the excitation coil current shown in FIG. 5 at a selected point in space near the excitation coil.

In the presence of eddy-current inducing structures, however, the actual magnetic field pattern near the structure will differ from the ideal as shown in FIG. 7. Here the actual magnetic field pattern 600 is initially zero. Once current begins to flow into the transmit coil, the actual magnetic field builds up slowly and does not perfectly follow the applied current. This slow response is due to the creation of eddy currents within conducting structures near the transmit coil. These eddy currents create bucking magnetic fields which partially cancel the magnetic field at the location of interest. The amplitude and duration of the eddy currents is a function of the conductivity and geometry of the eddy current inducing structures and can be modeled as the sum of a series of exponentially decaying currents, each with its own amplitude and time constant. Note that when the drive current I is removed, the magnetic field does not instantly return to zero, since the eddy currents have a finite decay time.

Figure 8:
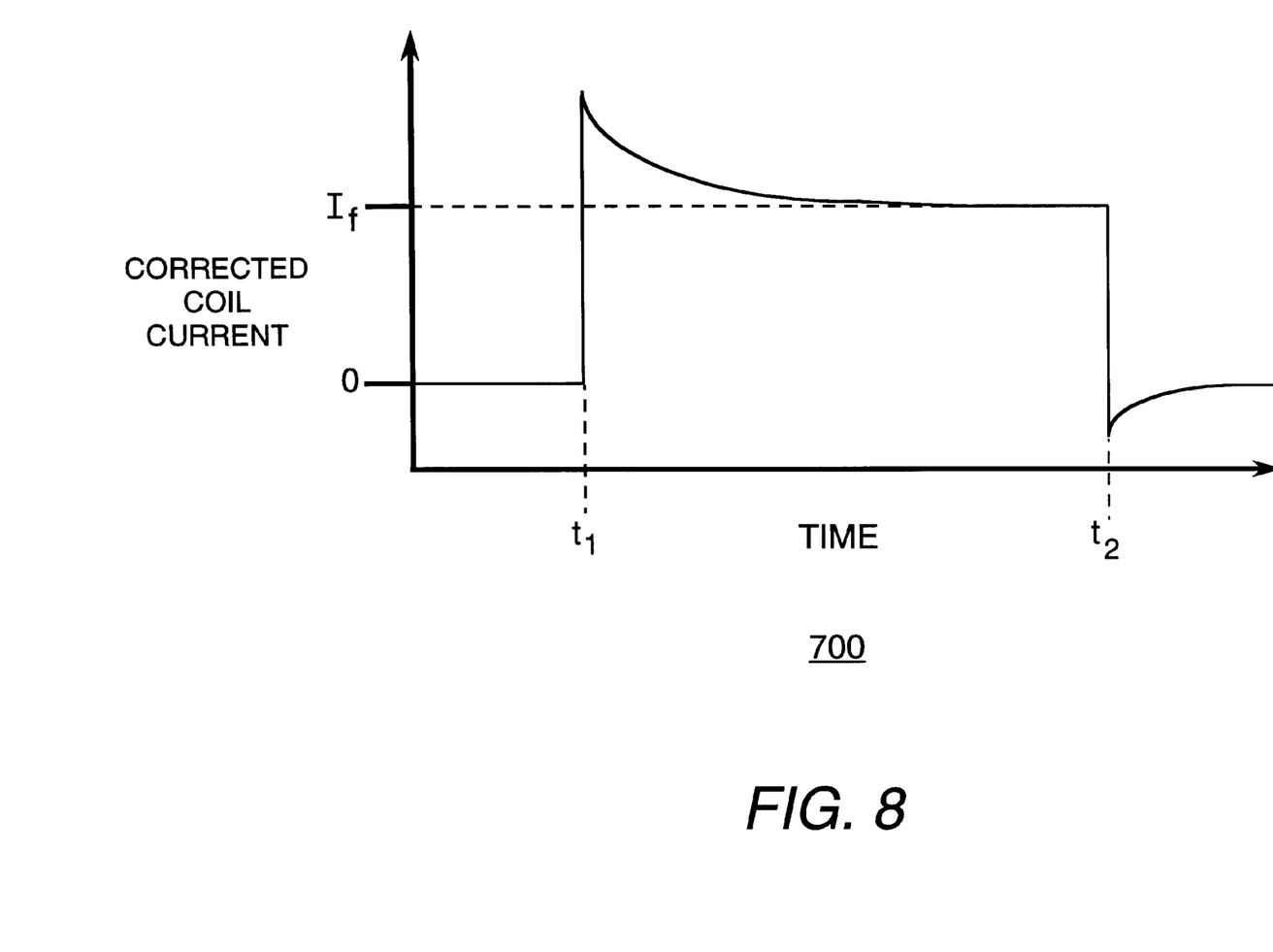
FIG. 8 is a diagram showing corrected current vs. time provided to an excitation coil in one embodiment of the present invention in order to compensate for time-dependent errors in the actual magnetic field.

In accordance with the present invention, the current applied to the transmit coils 131, 133, 135 in transmit coil assembly 130 is modified in a selected manner to compensate for these eddy current effects. This is illustrated as a corrected current pattern 700 in FIG. 8. Here a current $I_f$ applied to the coil, is the linear combination of ideal current $I_i$ pattern 400 and one or more compensation current patterns $I_c$ required to correct for eddy current induced deviations from the ideal field.

$$I_f = I_i + I_c.$$

In the present embodiment of the invention, these deviations are mathematically modeled as a linear combination of decaying exponential functions having a given amplitudes $A_1, A_2, A_3 \ldots$ and time constants $k_1, k_2, k_3 \ldots$ . The compensation current $I_c$ may be modeled as:

$$I_c = A_1 e^{-k_1 t} A_2 e^{-k_2 t} + \ldots$$

The amplitude and time constant of each correction term in corrected current pattern 700 are derived experimentally by observing the amplitude and time constants of deviations from expected ideal magnetic field pattern 500. The compensation current $I_c$ applied by current correction means 140 to the waveform may be determined by a calibration procedure. In one embodiment of the calibration procedure, known waveforms are applied to each transmit coil 131, 133, 135. The field changes detected by receive coils 121, 123, 125 are recorded. The mathematical difference between the known waveform applied to the transmit coil and the actual field detected by the receive coil is then computed, to determine time constants $k_1, k_2, k_3 \ldots$ and amplitudes $A_1, A_2, A_3 \ldots$ .

The computed times constants and amplitudes are passed to current correction means 140 and are used to modify the current waveforms sent to transmit coils 131, 133, 135 during subsequent tracking of invasive device 120.

In the present invention, the modifications to the current applied to the transmit coils 131, 133, 135 are performed by current correction means 140. Current correction means 140 is capable of modifying digital waveforms prior to analog amplification, and low-level analog signals prior to amplification, or modify currents after amplification as shown in FIG. 1.

Figure 9:
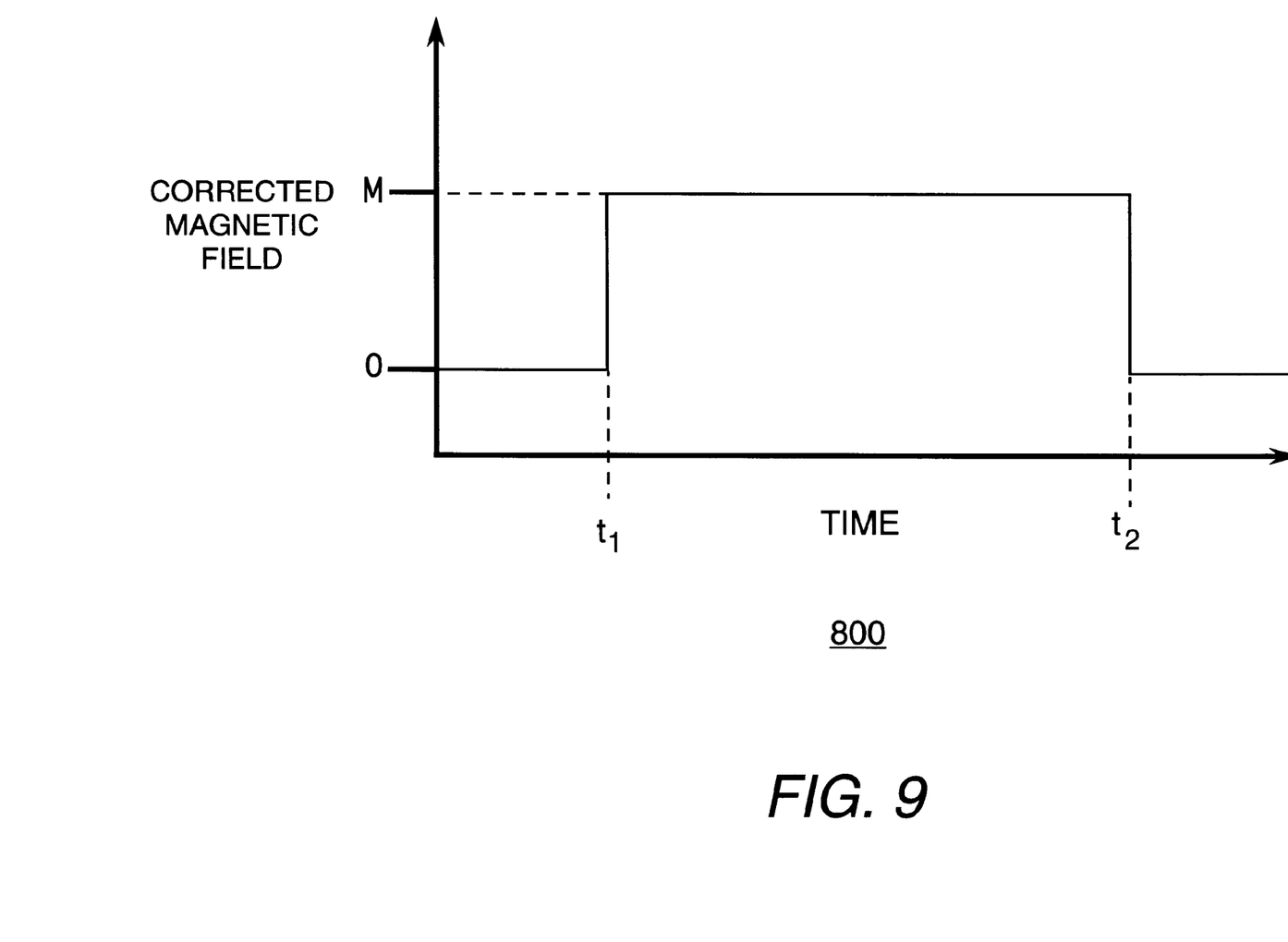
FIG. 9 is a diagram showing the actual magnetic field change vs. time created by the excitation coil excited with the corrected current of FIG. 8, at a selected point in space near the excitation coil.

The result of applying corrected current pattern 700 in the presence of eddy current inducing structures is shown in FIG. 9. Since corrected current pattern 700 is a linear combination of ideal current pattern 400 and the selected current corrections for eddy currents, a corrected magnetic field pattern 800 is obtained. Corrected magnetic field pattern 800 is close to ideal field pattern 500 and will yield tracking information whose accuracy is not degraded by the presence of eddy current inducing structures.

In an alternative embodiment of the present invention, the currents applied to the transmit coils contained within transmit coil assembly are not corrected. Rather, the detected signals are digitally corrected before analysis by adding a linear combination of exponential functions to the detected signal (instead of the transmit current as described above). The amplitude and time constants of these functions are derived experimentally.

While modification of the current applied to transmit coils 131, 133, 135 of transmit coil assembly 130 greatly reduces the effect of eddy currents on device localization, it does not reduce the eddy currents themselves.

A second embodiment of the present invention reduces the eddy currents directly by reducing the magnetic fields created by the transmit coils within the eddy current inducing structure. This second embodiment can be employed in conjunction with, or independently of, the first embodiment.

Figure 10:
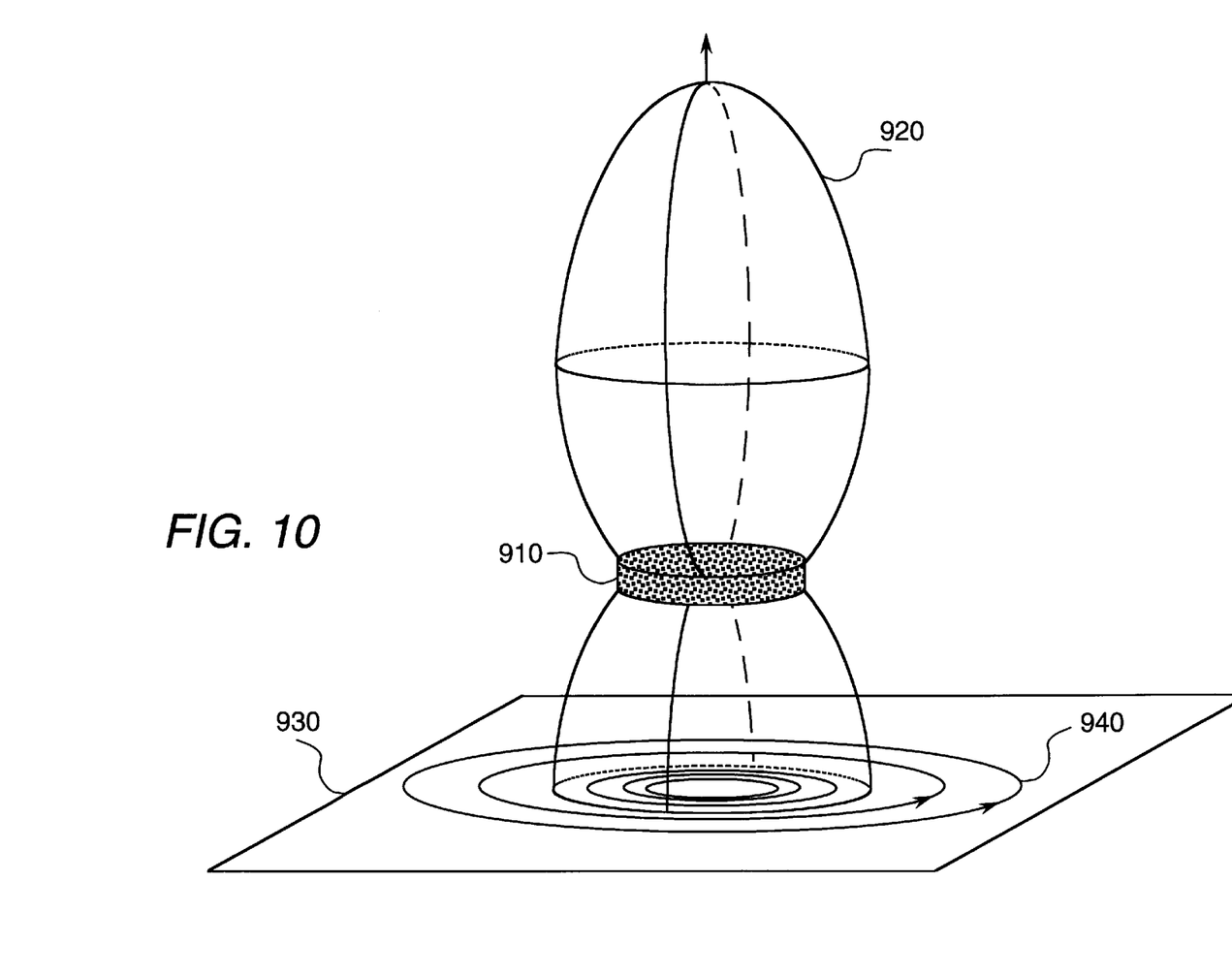
FIG. 10 is a diagram illustrating the intersection of an iso-field contour with a hypothetical superconducting sheet placed near the excitation coil.

To understand the second embodiment of the present invention, it is useful to examine the diagram of FIG. 10. Current is applied to a transmit coil 910 which causes the coil to create a dipole magnetic field. An iso-field contour 920 of the dipole is shown. Below the coil, a magnetic shield having a selected shape is placed. This shield is positioned between eddy current inducing structures and transmit coil 910. If desired and/or needed, the shield could be placed to the side of the coil or elsewhere. Likewise, the shield can have any geometry and more than one shield can be used to maximize the suppression of eddy currents in multiple structures.

In this embodiment of the present invention, the shield is an electrical coil 940 whose winding geometry is chosen such that magnetic fields within the eddy current inducing structures created by transmit coil 910 are canceled by applying a suitable current to the shield coil. In another embodiment, the shield is a superconducting sheet 930 which excludes the magnetic field generated by transmit coil 910.

One method to design the coil geometry of the shield employs a hypothetical superconducting sheet 930 having the same geometry and placement as the desired shield. Transmit coil 910 and the hypothetical sheet are mathematically modeled, and current patterns 940 created within the sheet by transmit coil 910 are determined. These current patterns are then used to determine paths of conductors in a actual shield design.

Figure 11:
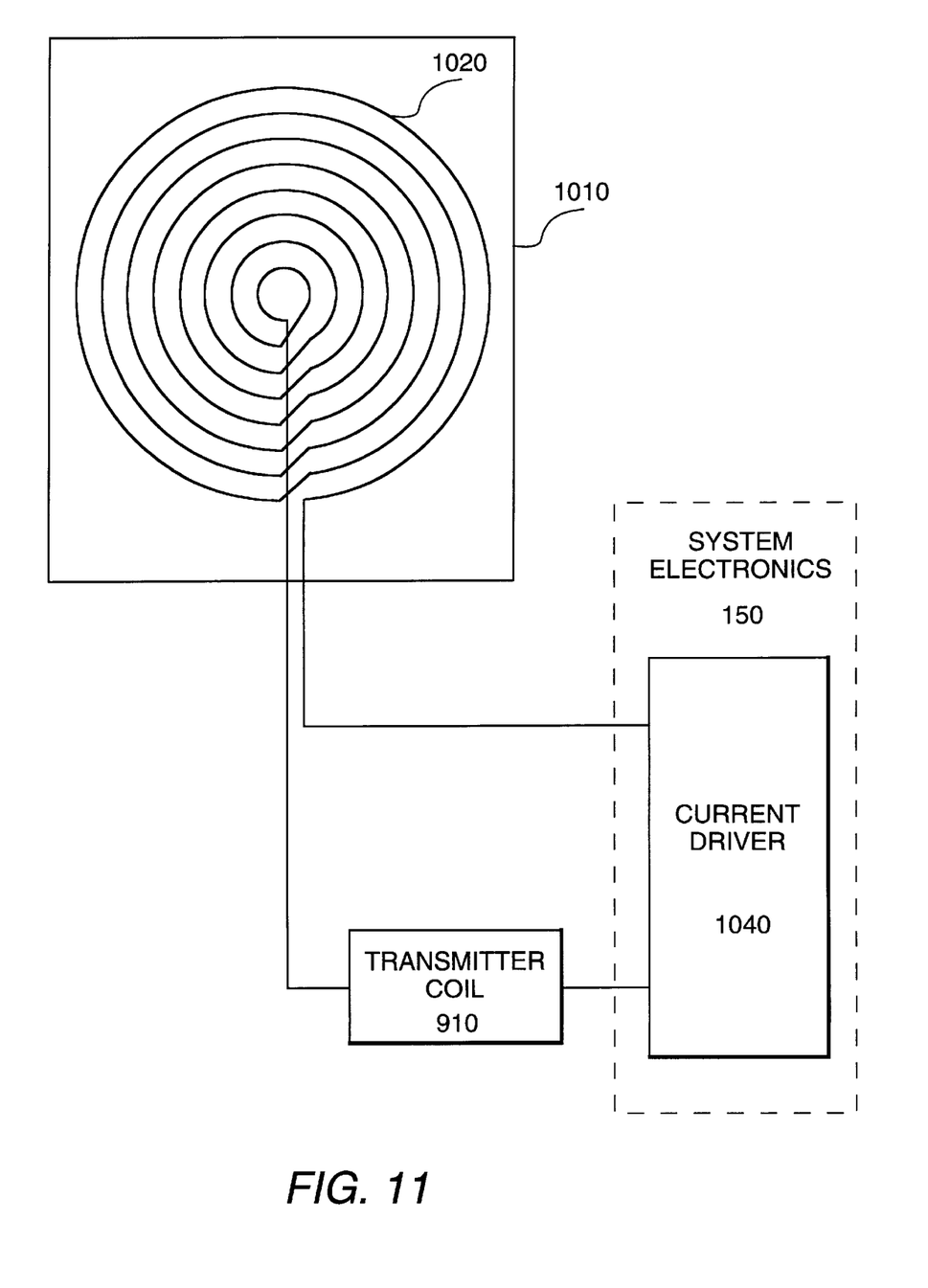
FIG. 11 is a schematic diagram illustrating a correction coil intended to be placed near the excitation coil, and operated in series with the coil to null magnetic fields in selected regions near the excitation coil.

One such design for a shield coil 1010 is shown in FIG. 11. Here the current patterns were determined to be a series of circular paths. The shield coil winding 1020 is constructed as a series of concentric circles which are electrically connected so that the circles are electrically in series. Current is supplied by a current driver 1040 incorporated into system electronics 150. In FIG. 11 shield coil 1010 is connected in series with a transmit coil 1030 so that the current flowing through the transmit coil 910 and shield coil 1020 are identical. In alternative embodiments, independent current drivers can be used for each coil.

While several presently preferred embodiments of the novel invention have been described in detail herein, many modifications and variations will now become apparent to those skilled in the art. It is, therefore, to be understood that the appended claims are intended to cover all such modifications and variations as fall within the true spirit of the invention.

What I claim is:

1. A system for determining a position of a device within a selected tracking volume, in the presence of at least one eddy current inducing structure, the system comprising:
   a) at least one transmit coil at a known location capable of creating a magnetic field within the selected tracking volume;
   b) at least one receive coil incorporated into the device being tracked for detecting changes in the magnetic field within the selected tracking volume;
   c) system electronics operating to supply a current of a selected amplitude, frequency and duration to the at least one transmit coil, and capable of receiving signals detected by the at least one receive coil; and
   d) a current correction means capable of modifying the current supplied to the at least one transmit coil by the electronics subsystem, said current correction means modifying said current by combining an ideal current with a compensation current, said compensation current being determined so that the resulting magnetic field within the selected tracking volume is substantially free of deviations from an ideal magnetic field caused by eddy currents in the at least one eddy current inducing structure.

2. The system for determining a position of a device within a selected tracking volume of claim 1 wherein the current correction means defines the compensation current mathematically by at least one exponential function having a selected amplitude and time constant.

3. The system for determining a position of a device within a selected tracking volume of claim 2 wherein current correction means operates to determine the amplitude and time constant of the compensation current iteratively by providing a plurality of different current waveforms measuring results and choosing the waveform with the best result.

4. The system for determining a position of a device within a selected tracking volume of claim 1 wherein the eddy current inducing structure is part of a Magnetic Resonance Imaging system.

5. A system for determining a position of a device within a selected tracking volume, in the presence of at least one eddy current inducing structure, the system comprising:
   a) at least one transmit coil at a known location capable of creating a magnetic field within the selected tracking volume;
   b) at least one receive coil incorporated into the device being tracked for detecting changes in the magnetic field within the selected tracking volume;
   c) system electronics operating to supply a current of a selected amplitude, frequency and duration to the at least one transmit coil, and capable of receiving signals detected by the at least one receive coil; and
   d) at least one respective shield coil placed in series with at least one corresponding transmit coil for conducting current to null the magnetic fields created by the at least one transmit coil in the at least one eddy current inducing structure.

6. The system for determining a position of a device within a selected tracking volume of claim 5 wherein the eddy current inducing structure is part of a Magnetic Resonance Imaging system.

7. The system for determining a position of a device within a selected tracking volume of claim 5 wherein the shield coil is driven independently of the corresponding transmit coil.

8. The system for determining a position of a device within a selected tracking volume of claim 5 wherein the shield coil has a planar geometry.

9. The system for determining a position of a device within a selected tracking volume of claim 5 wherein the shield coil has a complex geometry matched to the geometry of the eddy current inducing structure(s).

10. A system for determining a position of a device within a selected tracking volume, in the presence of at least one eddy current inducing structure, the system comprising:
    a) at least one transmit coil capable of creating a magnetic field within the selected tracking volume;
    b) at least one receive coil incorporated into the device being tracked for detecting changes in the magnetic field within the selected tracking volume;
    c) a system electronics subsystem capable of supplying a current of a selected amplitude, frequency and duration to said at least one transmit coil, and capable of receiving signals detected by the at least one receive coil;

d) a current modification means capable of modifying the current supplied to the at least one transmit coil by the electronics subsystem so that the resulting magnetic field within the selected tracking volume is substantially free of deviations from an ideal magnetic field caused by eddy currents within the eddy current inducing structure; and e) at least one respective shield coil placed near at least one corresponding transmit coil for conducting current to null the magnetic fields created by the at least one transmit coil in the eddy current inducing structure.

* * * * *